(12) United States Patent
Mardi et al.

(10) Patent No.: US 9,947,560 B1
(45) Date of Patent: Apr. 17, 2018

(54) INTEGRATED CIRCUIT PACKAGE, AND METHODS AND TOOLS FOR FABRICATING THE SAME

(71) Applicant: Xilinx, Inc., San Jose, CA (US)

(72) Inventors: Mohsen H. Mardi, Saratoga, CA (US); David Tan, San Jose, CA (US); Gamal Refai-Ahmed, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/358,513

(22) Filed: Nov. 22, 2016

(51) Int. Cl.
| | |
|---|---|
| *H01L 21/67* | (2006.01) |
| *H01L 21/48* | (2006.01) |
| *H01L 23/04* | (2006.01) |
| *H01L 23/498* | (2006.01) |
| *H01L 23/367* | (2006.01) |
| *H01L 21/687* | (2006.01) |

(52) U.S. Cl.
CPC .... *H01L 21/67121* (2013.01); *H01L 21/4817* (2013.01); *H01L 21/67098* (2013.01); *H01L 21/687* (2013.01); *H01L 21/68735* (2013.01); *H01L 23/04* (2013.01); *H01L 23/3675* (2013.01); *H01L 23/49811* (2013.01); *H01L 23/49866* (2013.01)

(58) Field of Classification Search
CPC ......... H01L 21/67005; H01L 21/67098; H01L 21/67103; H01L 21/67109; H01L 21/67121; H01L 21/67126; H01L 21/68; H01L 21/683; H01L 21/687; H01L 21/68714; H01L 21/68721; H01L 21/68735; H01L 21/4817; H01L 23/04; H01L 23/3675; H01L 23/49811; H01L 23/49866
See application file for complete search history.

(56) References Cited

U.S. PATENT DOCUMENTS

| | | | | |
|---|---|---|---|---|
| 4,836,434 | A * | 6/1989 | Takenaka | H01L 21/50 228/121 |
| 5,182,424 | A * | 1/1993 | Frank | H01L 21/50 174/521 |
| 5,436,202 | A * | 7/1995 | Miura | H01L 21/50 228/102 |
| 5,904,501 | A * | 5/1999 | Ohara | H01L 21/67126 257/704 |
| 6,730,991 | B1 * | 5/2004 | Douglas | H01L 23/047 257/625 |
| 7,534,467 | B2 * | 5/2009 | Kitano | H01L 21/67034 118/50 |
| 2007/0205501 | A1 * | 9/2007 | Lee | H01L 21/50 257/704 |

\* cited by examiner

*Primary Examiner* — Scott B Geyer
(74) *Attorney, Agent, or Firm* — Keith Taboada

(57) ABSTRACT

An integrated circuit (IC) package, assembly tool and method for assembling an IC package are described herein. In a first example, an IC package is provided that includes a package substrate, at least a first integrated circuit (IC) die and a cover. The first integrated circuit (IC) die is mechanically and electrically coupled to the package substrate via solder connections. The cover is bonded to the package substrate. The cover encloses the first IC die and is laterally offset from a peripheral edge of the package substrate.

7 Claims, 6 Drawing Sheets

US 9,947,560 B1

INTEGRATED CIRCUIT PACKAGE, AND METHODS AND TOOLS FOR FABRICATING THE SAME

TECHNICAL FIELD

Examples of the present disclosure generally relate to electronic circuits and, in particular, to an integrated circuit (IC) package, and methods and tools for fabricating the same.

BACKGROUND

An integrated circuit (IC) package can include multiple IC dies disposed on a substrate. A heat spreader, also known as a cover or lid, can be mounted to the substrate to cover the multiple IC dies. A thermal interface material can be disposed between the IC dies and the cover. An assembly process for attaching the cover to an IC package includes the application of a mechanical force to the cover at an elevated temperature. The IC packages typically have some warpage at room temperature prior to mounting the cover. After heating while mounting the cover, the warpage of the IC packages may by exasperated. Further, there are variations in the flatness of the cover, the assembly tools used while mounting the cover to the IC package, and the force applied to the cover during assembly. These variations in flatness, when combined with the change in curvature of the IC packages during assembly, result in application of non-uniform force to the IC packages and non-uniform heating of the IC packages. The non-uniform application of force and heating can cause mechanical stresses in the IC packages, which may result in cracking and/or delamination. Further, the amount of thermal interface material disposed between the IC dies and the cover may not be uniform due to the aforementioned variations, thus creating areas of higher thermal resistance, i.e., hot spots, in certain locations of the IC packages.

Thus, there is a need for an improved IC package, along with methods and tools for fabricating the same.

SUMMARY

An integrated circuit (IC) package, assembly tool and method for assembling an IC package are described herein. In a first example, An integrated circuit (IC) package, assembly tool and method for assembling an IC package are described herein. In a first example, an IC package is provided that includes a package substrate, at least a first integrated circuit (IC) die and a cover. The first integrated circuit (IC) die is mechanically and electrically coupled to the package substrate via solder connections. The cover is bonded to the package substrate. The cover encloses the first IC die and is laterally offset from a peripheral edge of the package substrate.

In another example, an assembly tool for assembling an integrated circuit (IC) package is provided. The assembly tool includes a base assembly, a clamp removable from the base assembly, and a cover plate. The clamp includes a first aperture formed between sidewalls. The aperture also extends between a top surface and a bottom surface. The clamp also includes a first notch formed in the bottom surface of the sidewalls that is open to the first aperture. The cover plate has a first boss that is configured to extend into the first aperture.

In yet another example, a method for assembling an integrated circuit (IC) package is provided. The method includes clamping edges of a first integrated circuit (IC) assembly between a base assembly of an assembly tool and a clamp of the assembly tool; applying a force to a first cover, the force urging the first cover against the first IC assembly; and securing the first cover to the first IC assembly to form a first integrated circuit (IC) package.

These and other aspects maybe understood with reference to the following detailed description.

BRIEF DESCRIPTION OF THE DRAWINGS

So that the manner in which the above recited features can be understood in detail, a more particular description, briefly summarized above, maybe had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example maybe beneficially incorporated in other examples.

DETAILED DESCRIPTION

Figure 1:
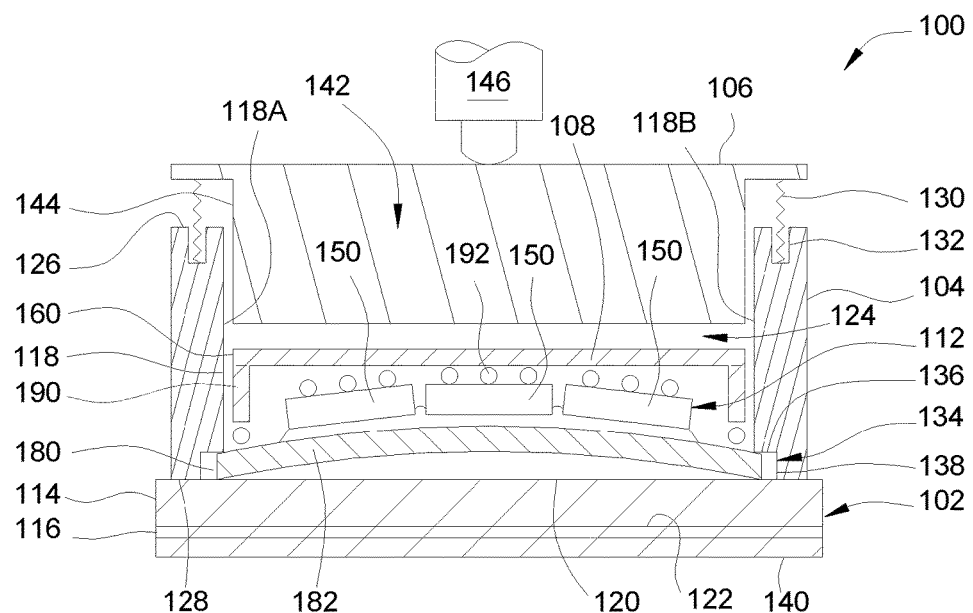
FIG. 1 is a sectional view of an assembly tool for use in forming an integrated circuit (IC) package, the assembly tool shown loaded with an IC package prior to clamping.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a sectional view of an assembly tool 100 for use in forming an integrated circuit (IC) package 110. The assembly tool 100 is shown loaded with a cover 108 and an integrated circuit (IC) assembly 112 of the IC package 110 prior to clamping and assembly.

The assembly tool 100 includes a base assembly 102, a clamp 104 and a cover plate 106. The base assembly 102, the clamp 104 and the cover plate 106 are separate unitary components, which when assembled, are utilized to secure the cover 108 to the IC assembly 112 to form the IC package 110. The IC package 110, later described with reference to FIG. 3, also includes one or more integrated circuit (IC) dies 150 disposed on a package substrate 182. In the embodiment depicted in FIG. 1, the dies 150 and package substrate 182 are part of the IC assembly 112 prior to bonding the cover 108 to the package substrate 182.

Continuing to refer to FIG. 1, the base assembly 102 includes a base plate 114 and a heater 116. The base plate 114 is generally made from a rigid material, such as metal. Examples of suitable metals include tool steel, stainless steel, aluminum, copper, cold rolled steel or other suitable metal. Although it is contemplated that other rigid materials may be utilized for the base plate 114, materials that have good (i.e., high) thermal conductivity contribute to more efficiently assembled and robustly fabricated IC packages 110 exiting the assembly tool 100.

The base plate 114 includes a top clamping surface 120 and a bottom surface 122. The IC assembly 112 is disposed on the top clamping surface 120 during fabrication of the IC package 110. The top clamping surface 120 generally has a flatness of about 1-100 um, such as about 1-60 um and about 1-75 um. A bottom surface 128 of the clamp 104 also has a flatness of about 40-60 um. Since the base plate 114 and clamp 104 are separately manufactured, the flatness and coplanarity of these components can be more precisely achieved as opposed to conventionally fabricated single piece tools. The high flatness and coplanarity of the top clamping and bottom surfaces 120, 128 enables the IC package 110 to be assembled with a similar flatness and a high degree of parallelism, thus minimizing warpage, and with more uniform curing of thermal interface material and other adhesives within the IC package, which reduces hot spots. Advantageously, since the IC package 110 has less warpage, the IC package 110 also is less susceptible to mechanical stresses that lead to cracking and delamination.

The heater 116 is utilized to heat the base plate 114, and ultimately the IC package 110 during clamping. The heater 116 maybe a cartridge heater disposed in the base plate 114, an resistive heater circuit adhered to the bottom surface 122 of the base plate 114, or other heater suitable to heat the IC package 110 above room temperature. In one example, the heater 116 can heat the IC package 110 to a temperature of between about 25 to about 1200 degrees Celsius, such as between about 100 and about 150 degrees Celsius. In one example, the heater 116 is a resistive heating element arranged in a layer that is adhered to a bottom 118 of the base plate 114. A protective plate 140 maybe disposed over the heater 116 to protect the heater 116 from damage. As the protective plate 140 also sandwiches the heater 116 against the base plate 114, the efficiency of the heater 116 is also improved. The protective plate 140 maybe formed from a metal or plastic compatible with the heat generated by the heater 116.

The clamp 104 is disposed on the top clamping surface 120 of the base plate 114. One or more alignment pins (not shown) maybe disposed between the clamp 104 and the base plate 114 to ensure repeatable alignment between the clamp 104 and the base plate 114. The clamp 104 may fabricated from the same similar materials as the base plate 114. Optionally, the clamp 104 maybe fabricated from a material different than the material of the base plate 114.

The clamp 104 includes sidewalls 118 that have an inner surface 136 oriented in a frame, ring-shape or window arrangement. The ring-shaped inner surface 136 surrounds an aperture 124 sized to accommodate the cover 108 and at least a portion of the IC assembly 112 forming the IC package 110. The aperture 124 maybe substantially rectangular in shape, but maybe configured to have other shapes suitable for assembly of the particular shape and size of the IC package 110. In the embodiment depicted in FIG. 2, two parallel and opposing sides 118A and 118B of the sidewalls 118 are shown, which the adjacent sides not shown in FIG. 1 connecting side 122A to side 112B.

The sidewalls 118 has a top surface 126 located opposite the bottom surface 128. The top surface 126 is configured to interface with the cover plate 106. Alignment between the top surface 126 and the cover plate 106 maybe facilitated using dowels pins, bearings, or other alignment structures. Optionally, a plurality of resilient force generating objects (FGO) 130 maybe disposed between the top surface 126 of the sidewalls 118 and the cover plate 106 to support the cover plate 106 over the components of the IC package 110 disposed in the assembly tool 100. The FGOs 130 may be springs and/or elastic material that and store and release energy. When FGOs 130 are present, weights or an actuator (collectively actuator 146) maybe utilized to urge the cover plate 106 against the cover 108 to secure the cover 108 to the IC assembly 112. The top surface 126 may include spring retaining holes 132 that accept a portion of the FGOs 130 so that the FGOs 130 do not fall from the assembly tool 100 once the cover plate 106 is removed.

In one example, the FGOs 130 may be fabricated from a thermally conductive material, such as a metal. The metal FGOs 130 also enhance heat transfer between the cover plate 106 and the clamp 104. For example, FGOs 130 may be metal springs. Thus, as the clamp 104 is heated by the base assembly 102, the metal FGOs 130 provide efficient heat transfer to the cover plate 106, which allows the cover plate 106 to heat the cover 108. As the cover 108 can be more efficiently heated by use of the FGOs 130, the adhesives and thermal interface materials disposed in the IC package 110 may be more efficiently and evenly cured.

As discussed above, the bottom surface 128 of the sidewalls 118 is configured to interface with the base plate 114. Alignment between the bottom surface 128 and the base plate 114 maybe facilitated using dowels pins, bearings, or other alignment structures. The bottom surface 128 additionally has a flatness of about 1-60 um. The flatness of the bottom surface 128 of the sidewalls 118 and the base plate 114 allow these two surfaces to match with high precision, and thus improving the force distribution of the cover plate 106 across the cover 108 of the IC package 110, which substantially reduces stress induced warping after assembly of the IC package 110. Moreover, the high flatness between the bottom surface 128 of the sidewalls 118 and the base plate 114 promotes efficient heat transfer therebetween, thereby allowing the heater 116 to more efficiently heat the IC package 110 during assembly.

A notch 134 is defined at the interface between the bottom surface 128 and the inner surface 136 of the sidewalls 118. The notch 134 is open to the aperture 124 to allow entry of a peripheral edge 180 of the package substrate 182 into the notch 134. The notch 134 includes a notch sidewall 138 and a notch top 140. One each side of the sidewall 118, the notch sidewall 138 is substantially parallel with, and faces the same direction as the inner surface 136. In one example, the notch 134 is present around the entire length of the sidewall 118, and thus, extends completely around the aperture 124. In other examples, the notch 134 maybe present on only two opposing sides of the sidewall 118, or other combination.

In one example, an outside edge 160 of the cover 108 (or stiffener 190, if present) is laterally offset inward from the peripheral edge 180 of the package substrate 182 of the IC assembly 112 by a distance (illustrated by reference numeral 512 in FIG. 5) of at least 1 mm. The lateral offset provides sufficient area for the sidewall 118 to robustly engage and clamp the package substrate 182. Having the cover 108 laterally offset too far from the peripheral edge 180 reduces the effectiveness of retaining the package substrate 182 in a substantially flat and non-warped orientation essentially conformal to the flat surface of the base plate 114.

The notch sidewall 138 and the notch top 140 are generally sized to accommodate the edge 180 of the package substrate 182. For example, a height of the notch sidewall 138 is selected to be substantially the same as or slightly greater than a thickness of the package substrate 182 so that the package substrate 182 can be positioned by the notch 134 while being conformally held against the flat base plate 114. A width of the notch top 140 is selected to provide sufficient surface area to ensure the notch 134 remains engaged with the package substrate 182 throughout the range of manufacturing tolerances for both the package substrate 182 and the aperture 124 of the assembly tool 100. The notch top 140 and the bottom surface 128 of the sidewall 118 are parallel, and may have a parallelism within 1-60 um. The high parallelism between the notch top 140 and the bottom surface 128 ensures uniform clamping force is applied to the package substrate 182.

The cover plate 106 is utilized to press the cover 108 against the IC assembly 112 during fabrication of the IC package 110. The cover plate 106 maybe configured with sufficient mass to provide the required force applied to the cover 108 during assembly, or additional weights maybe applied to the cover plate 106 or an actuator 146 maybe utilized as described above. Suitable actuators 146 include motors, pneumatic cylinders, hydraulic cylinders or other suitable force generating devices. The cover plate 106 maybe formed from stainless steel, aluminum, cold rolled steel, other metals, rigid plastic or other suitable material.

Figure 2:
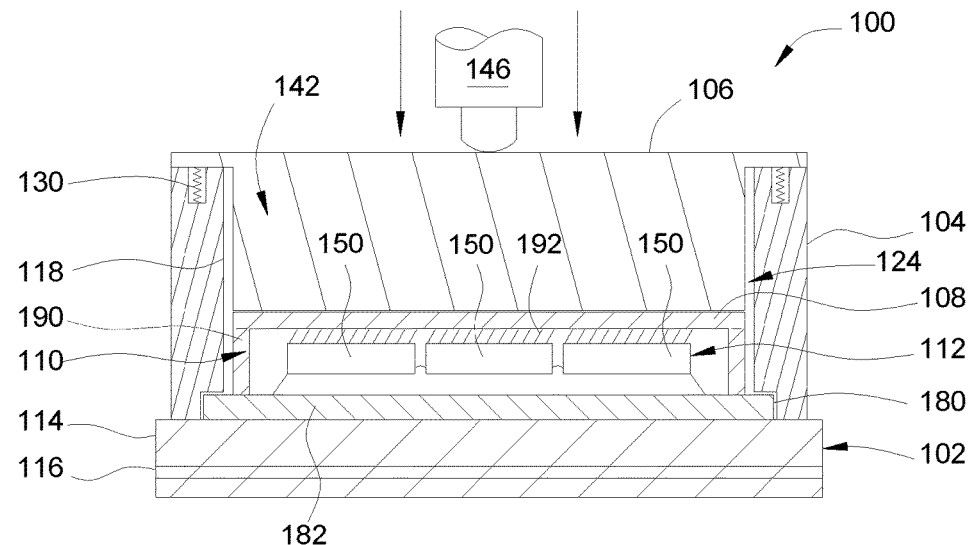
FIG. 2 is a sectional view of the assembly tool of FIG. 1 shown clamping the IC package.

The cover plate 106 may include a boss 142. The boss 142 may also be utilized to align the cover plate 106 with the clamp 104. For example, the boss 142 may fit closely with the inner surface 136 of the sidewalls 118 as the boss 142 enters the aperture 124. The boss 142 has a boss sidewall 144 that is configured to project into the aperture 124. A length of the boss sidewall 144 is selected commensurate with a height of the sidewalls 118 and an amount that the IC assembly 112 extends into the aperture 124. The length of the boss sidewall 144 is selected to ensure that the boss 142, when the cover plate 106 is urged towards the base plate 114, contacts the cover plate 106 with sufficient force to both press the cover plate 106 against the IC assembly 112 and to cause the package substrate 182 to conformally flatten against the base plate 114. For example, the package substrate 182 generally has some warpage when first loaded into the assembly tool 100, which as shown in FIG. 1. Once the cover plate 106 is engaged with sufficient force against the cover 108, the force transmitted through the cover 108 (and stiffener 190, if present), conformally flattens the package substrate 182 to the base plate 114, as shown in FIG. 2.

During the assembly process, a thermal conductive layer (TCL) 192 maybe utilized to thermally and/or mechanically couple the cover 108 to the IC dies 150. The TCL 192 maybe selected to provide a thermally conductive path between the cover 108 to the IC dies 150 so that heat generated by the IC dies 150 maybe dissipated through the cover 108. The TCL 192 can be organic material such as KJJ material series from Shin-Etsu Chemical Co., Ltd., a polymer material such as SE4450 from Dow Corning, a metal as Indium from Indium Corporation), or other suitable material.

The TCL 192 generally good conductivity of heat transfer. In one example, the TCL 192 may have a thermal conductivity of between about 1 to about 100 W/mK. Examples of materials suitable for use the TCL 192 includes thermal grease, thermally conductive epoxy, phase change materials, conductive tapes, and silicone-coated fabrics among other suitable materials. The TCL 192 maybe a soft or compliant adhesive to allow compensation between mismatched heights of neighboring IC dies 150 within the IC package 110. In one example, the TCL 192 maybe a thermal gel or thermal epoxy, such as for example, packaging component attach adhesives available from Al Technology, Inc., located in Princeton Junction, N.J. In another example, the TCL 192 maybe a applying phase change material, such as Laird PCM 780.

The TCL 192 may be dispensed on the IC dies 150 in droplet form as shown in FIG. 1. Once the TCL 192 is squeezed between the cover 108 and IC dies 150 as the cover 108 is urged against the package substrate 182, the droplets of TCL 192 are transformed into a thin film, as shown in FIG. 2.

The cover 108 is also adhered to the package substrate 182 during the assembly process. For example, an adhesive 194, such as an epoxy, maybe dispensed on the package substrate 182 in droplet form as shown in FIG. 1. Once the adhesive 194 is squeezed between the cover 108 and the package substrate 182 as the cover 108 is urged against the package substrate 182, the droplets of adhesive 194 are transformed into a thin film, as shown in FIG. 2. In embodiments wherein the cover 108 and stiffener 190 are both present, the adhesive 194 maybe utilized between the cover 108 and stiffener 190 and the stiffener 190 and the package substrate 182.

The cured TCL 192 and adhesive 194 helps maintain the package substrate 182 in a flat state that is substantially conformal to the base plate 114 after assembly. The substantially flat package substrate 182 has reduced mechanical stress, which advantageously resists cracking and delamination.

To promote curing and bonding utilizing the TCL 192 and adhesive 194, the assembly tool 100 maybe heated while the cover 108 is urged against the base plate 114. In one example, the IC package 110 disposed on the base plate 114 is heated by the heater 116 to a temperature sufficient to cur the TCL 192 and adhesive 194. For example, the IC package 110 is heated by the heater 116 to a temperature of at least above room temperature, such as between about 100 and 150 degrees Celsius.

Although the assembly tool 100 described above is suitable for assembling a single IC package 110, the assembly tool 100 maybe adapted to assembly a plurality of IC packages 110 simultaneously. For example, the assembly tool 100 maybe configured with a plurality of apertures 124, where each aperture 124 is adapted to accommodate a separate IC package 110.

Figure 3:
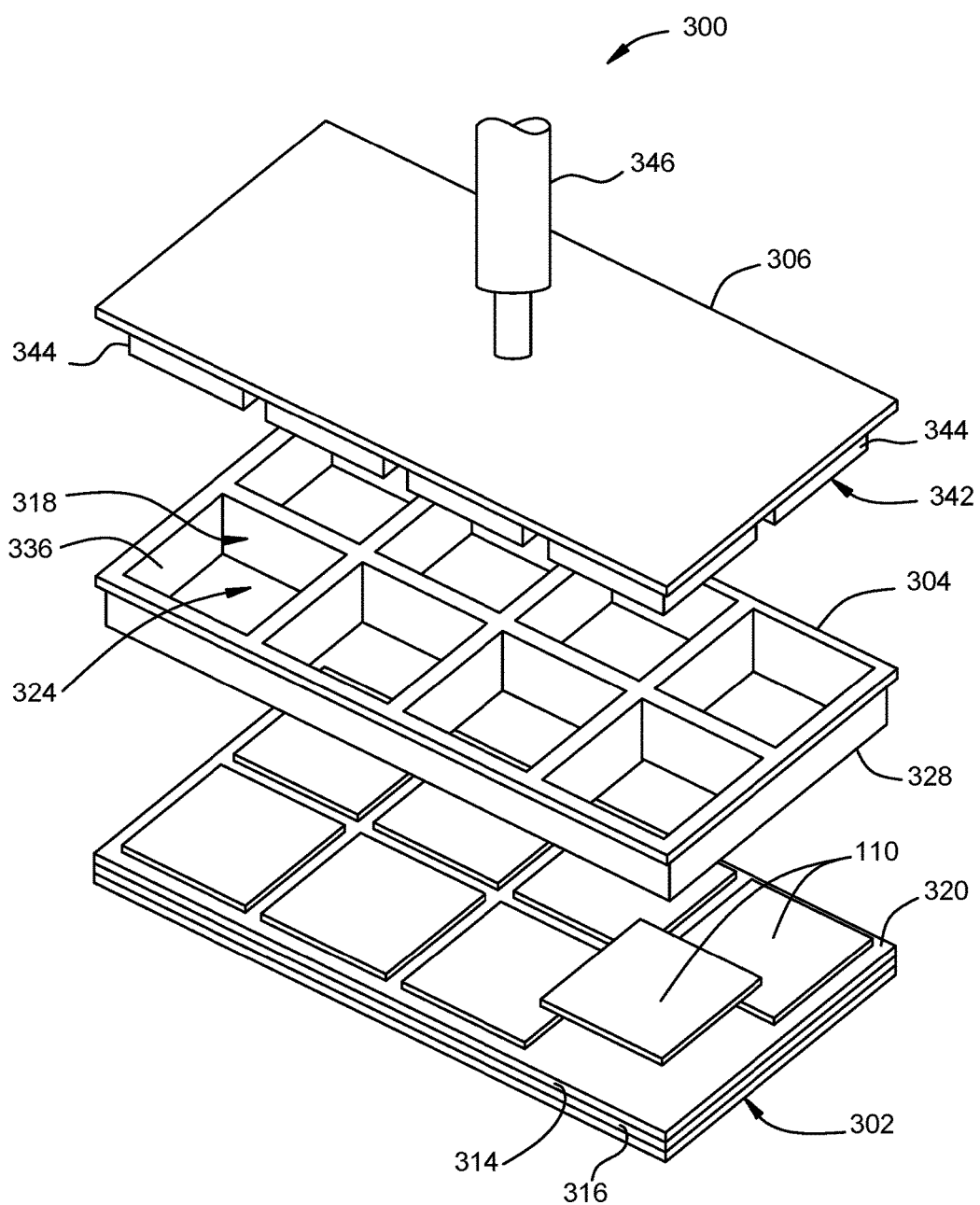
FIG. 3 is a top exploded view of an assembly tool for use in forming a plurality of IC packages.
Figure 4:
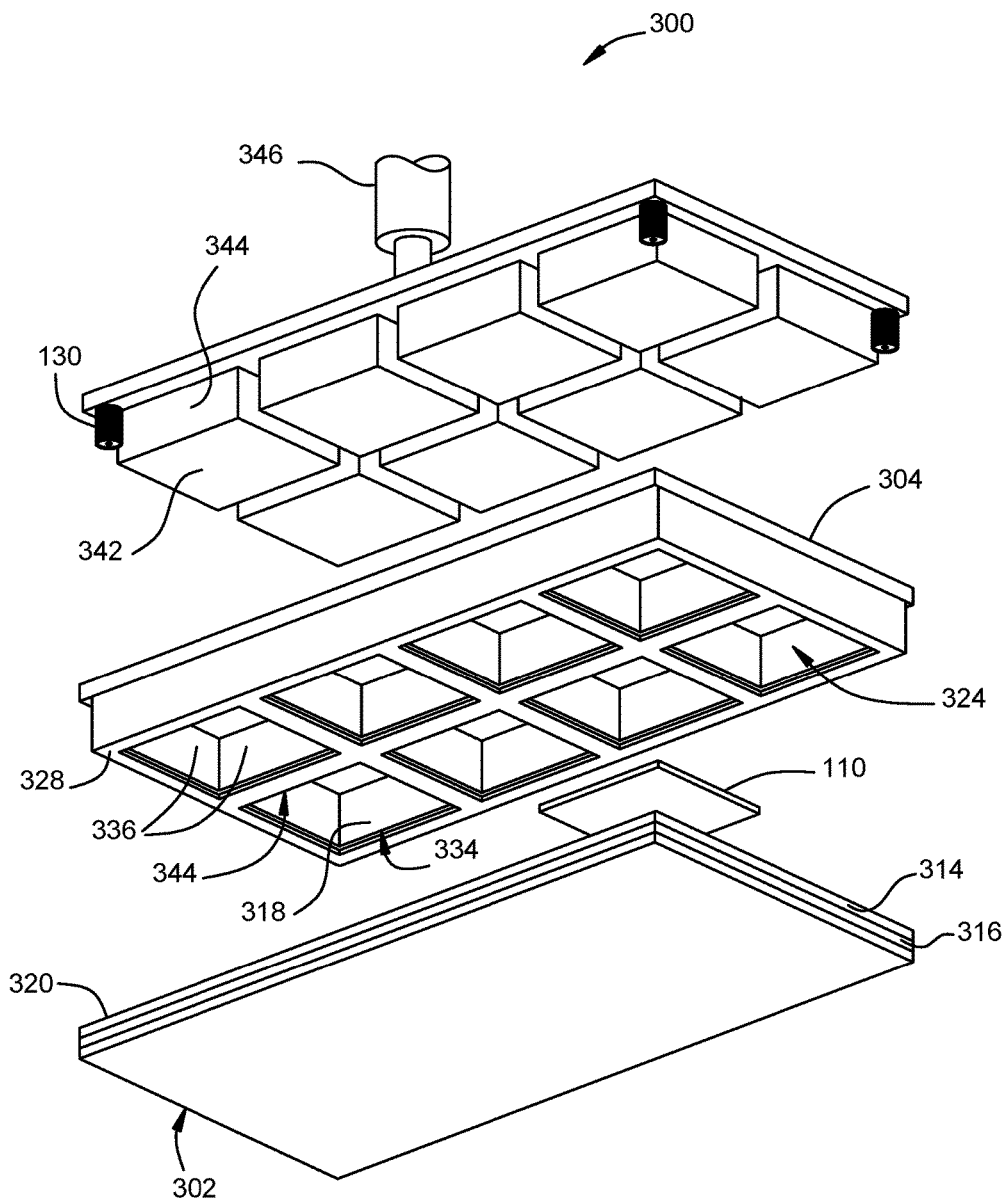
FIG. 4 is a bottom exploded view of the assembly tool of FIG. 3.

FIG. 3 is a top exploded view of an assembly tool 300 for use in forming a plurality of IC packages 110. FIG. 4 is a bottom exploded view of the assembly tool of FIG. 3. Referring to both FIGS. 3 and 4, the assembly tool 300 generally includes a base assembly 302, a clamp 304 and a cover plate 306. The base assembly 302, a clamp 304 and a cover plate 306 are configured substantially similar to the base assembly 102, the clamp 104 and the cover plate 106 described above. The base assembly 302, the clamp 304 and the cover plate 306 are separate unitary components, which when assembled, are utilized to secure covers 108 to a plurality of IC assemblies 112 to simultaneously form a plurality of IC packages 110. The base assembly 302 includes a base plate 314 and a heater 316. The base plate 314 and the heater 316 are fabricated as described above with reference to the base plate 114 and heater 116, except wherein the base plate 314 and the heater 316 are larger to accommodate the additional IC packages 110 that are handled by the assembly tool 300. The base plate 314 includes a top clamping surface 320 than has a flatness of about 40-60 um. The high flatness of the top clamping surface 320 enables the IC package 310 to be formed substantially without warpage.

The clamp 304 is disposed on the top clamping surface 320 of the base plate 314. One or more pins (not shown) maybe disposed between the clamp 304 and the base plate 314 to ensure repeatable alignment between the clamp 304 and the base plate 314. The clamp 304 may fabricated from the same similar materials as the clamp 104.

The clamp 304 includes sidewalls 318 arranged to partition a plurality of apertures 324. Each aperture 324 is bounded by an inner surface 336 of the sidewalls 318. The apertures 324 are sized to accommodate the cover 108 and at least a portion of the IC assembly 112 forming the IC package 110. The apertures 324 maybe substantially rectangular in shape and arranged in an array of rows and columns, but maybe configured to have other arrangements and shapes suitable for assembly a particular shape and size of the IC package 110. In the embodiment depicted in FIGS. 3-4, the sidewalls 318 are configured to arrange the apertures 324 in a two dimensional array.

The sidewalls 318 have a top surface 326 and a bottom surface 328. The top surface 326 is configured to interface with the cover plate 306. An actuator 346 (shown in phantom) maybe utilized to urge the cover plate 306 against the covers 108 disposed in the assembly tool 300 to secure the covers 108 to the IC assemblies 112. The actuator 346 may be the same or similar to the actuator 146.

The bottom surface 328 of the sidewalls 318 is configured to interface with the base plate 314. The bottom surface 328 additionally has a flatness of about 40-60 um, which provides the advantages described above.

Notches 334 are defined at the interface between the bottom surface 328 and the inner surface 336 of the sidewalls 318. Each notch 334 is open to a respective one of the apertures 324. The notches 334 are configured as described above with reference to the notch 134 to facilitate clamping of the IC packages 110 within the apertures 324. As such, the notches 334 are present on at least two opposing sides of each aperture 324.

The cover plate 306 is utilized to press the covers 108 against the IC assemblies 112 during fabrication of the IC packages 310. The cover plate 306 maybe configured with sufficient mass to provide the required force to be applied to the covers 108, or additional weights maybe applied to the cover plate 306 or an actuator 346 maybe utilized as described above. Suitable actuators 346 include motors, pneumatic cylinders, hydraulic cylinders or other suitable force generating devices. The cover plate 306 maybe formed from stainless steel, aluminum, cold rolled steel, other metals, rigid plastic or other suitable material.

The cover plate 306 includes multiple bosses 342. The bosses 342 are arranged so that each boss 342 engages, i.e., slips into, a respective one of the apertures 324. Each boss 342 has a boss sidewall 344. A length of the boss sidewall 344 is selected commensurate with a height of the sidewalls 318 and an amount that the IC assembly 112 extends into the aperture 324. The length of the boss sidewall 344 is selected to ensure that the boss 342, when the cover plate 306 is urged towards the base plate 314, contacts the cover plate 306 with sufficient force to both press the cover plate 306 against the IC assembly 112 and to cause the package substrate 182 to conformally flatten against the base plate 314.

The assembly tool 300 operates essentially in the same manner as the assembly tool 100. Advantageously, the assembly tool 300 can assembly multiple IC packages 110 simultaneously while providing excellent flatness and reduction in the number of hot spots within the package 110 as compared to conventional assembly techniques.

Figure 5:
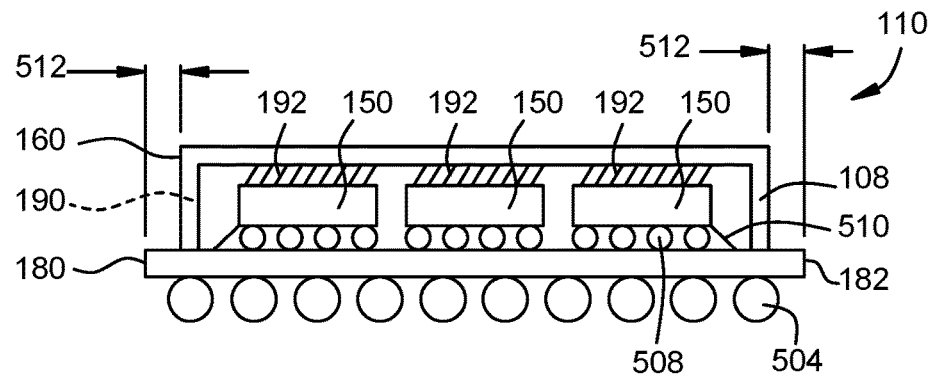
FIG. 5 is a sectional view of one embodiment of an IC package fabricated utilizing an assembly tool.
Figure 6:
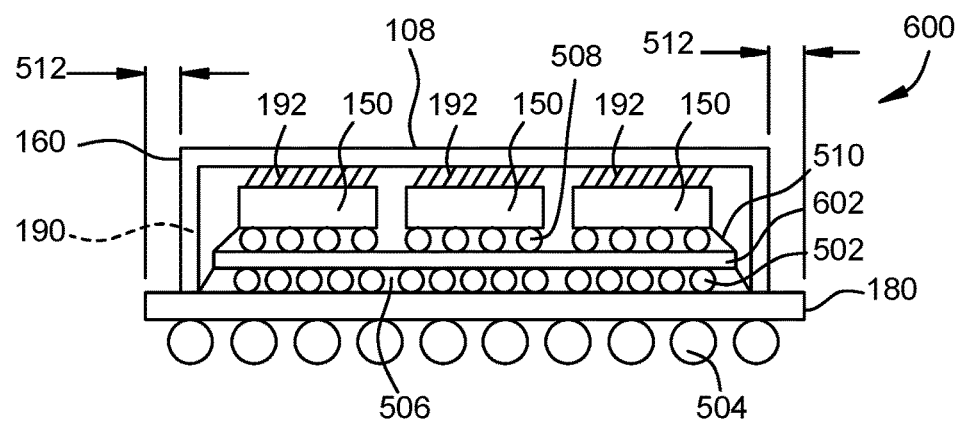
FIG. 6 is a sectional view of one embodiment of an IC package fabricated utilizing an assembly tool.

FIGS. 5 and 6 are sectional views of various embodiments of the IC packages 110, 600 fabricated utilizing an assembly tool, such as the assembly tools 100, 300 described above, or other suitable assembly tool. As discussed above, the IC package 110 includes a package substrate 182 on which a cover 108 is adhered. Optionally, a stiffener 190 (shown in phantom) may be present between the cover 108 and package substrate 182. At least one IC die 150 is coupled to the package substrate 182. Three IC dies 150 are shown in FIGS. 5 and 6 for purposes of illustration. In some embodiments, such as shown in FIG. 6, the IC dies 150 are connected by a substrate-through-via (TSV) interposer 602 to the package substrate 182. Although three IC dies 150 are shown ins FIGS. 5 and 6, the number of IC dies 150 may range from one to as many as can be fit within the IC package 110.

The interposer 602 includes circuitry for electrically connecting the circuitry of the IC dies 150 to circuitry of the package substrate 182. The circuitry of the interposer 602 may optionally include transistors, capacitors, wells, and the like. Package bumps 502, also known as "C4 bumps," are utilized to provide an electrical connection between the circuitry of the interposer 602 and the circuitry of the package substrate 182. The package substrate 182 may be mounted and connected to a printed circuit board (PCB, not shown), utilizing solder balls 504, wire bonding or other suitable technique. An undermolding 506 maybe utilized to fill the space not taken by the package bumps 502 between the package substrate 182 and the interposer 602, thereby providing structural rigidity to the IC package 110.

The IC dies 150 are mounted to one or more surfaces of the interposer 602 as shown in FIG. 6, or alternatively in embodiments wherein an interposer is not utilized such as FIG. 5, directly to the package substrate 182. The IC dies 150 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 6, the IC dies 150 are mounted to a top surface of the interposer 602 by a plurality of micro-bumps 508. The micro-bumps 508 electrically connect the circuitry of each IC die 150 to circuitry of the interposer 602. The circuitry of the interposer 602 connects the micro-bumps 508 to selective package bumps 502, and hence, connects selective circuitry of each IC die 150 to the package substrate 182, to enable communication of the IC dies 150 with the PCB after the IC package 110 is mounted within an electronic device (not shown). When the optional interposer 602 is not present such as shown in FIG. 5, the micro-bumps 508 connects selective circuitry of each IC die 150 to the package substrate 182 to enable communication of the IC dies 150 with the PCB. An undermolding 510 may be utilized to fill the space not taken by the micro-bumps 508 between the IC dies 150 and interposer 602 to provide structural rigidity to the IC package 110.

The cover 108 is disposed over the IC dies 150. In some embodiments, the cover 108 is fabricated from a plastic material or other suitable material. In other embodiments particularly where it is desirable to utilize the cover 108 to receive heat from the IC dies 150, the cover 108 maybe fabricated from a thermally conductive material, such as copper, nickel-plated copper or aluminum, among other suitable materials. The cover 108 may have a thickness of between about 0.5 mm and about 3.0 mm, although other thicknesses maybe utilized.

Figure 7:
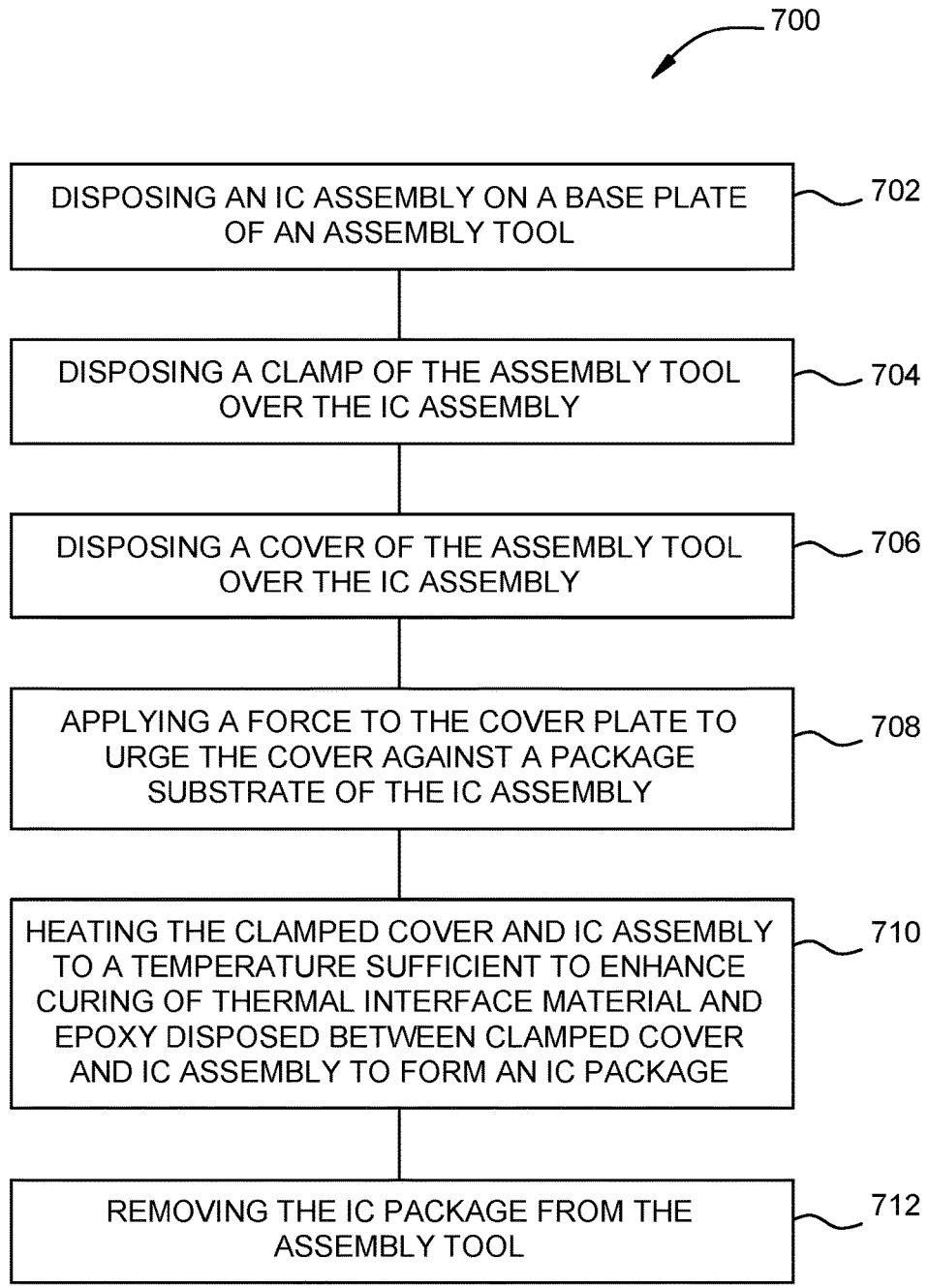
FIG. 7 is a block diagram of a method for forming an IC package utilizing an assembly tool.

The cover 108 circumscribes the IC dies 150. An outside edge 160 of the cover 108 (or stiffener 190, if present) is offset laterally inward from at least two opposing peripheral edges 180 of the package substrate 182 by a distance 512 of at least 1 mm. In some embodiments, the cover 108 is offset laterally inward from all peripheral edges 180 of the package substrate 182 by the distance 512 to allow clamping of the package substrate 182 from four sides. The offset distance 512 allows the notch 134 of the assembly tools 100, 300 to precisely locate and clamp the package substrate IC package 110, 600 therein. The cover 108 provides mechanical support that helps prevent the IC package 110, 600 from bowing and warpage. The cover 108 also helps spread the heat generated by the IC dies 150 within IC package 110, 600. The cover 108 may integrally include a stiffener 190 may be a single layer structure, or the cover 108 and the stiffener 190 may be a multi-layer structure. If a structure separate from the cover 108, the stiffener 190 may alternatively be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, or from organic materials such as copper-clad laminate, among other materials FIG. 7 is a block diagram of a method 700 for forming an IC package utilizing an assembly tool. The method 700 maybe performed in any of the assembly tools 100, 300 described above, or other suitable tool. The method 700 can be used to fabricate the IC packages 110, 600 described above, an IC package 800 described below, or other suitable IC packages.

The method 700 begins by disposing an IC assembly on the base plate at operation 702. In embodiments wherein the assembly tool accommodates multiple IC packages, the multiple IC assemblies are disposed on the base plate.

At operation 704, the clamp is disposed over the IC assembly such that the IC assembly enters the aperture defined in the sidewall of the clamp. The peripheral edges of the package substrate of the IC assembly engage with the notches formed in the sidewalls.

At operation 706, a cover is disposed over the IC assembly. The cover may be disposed over the IC assembly prior to, or after the clamp is disposed on the base assembly. TCL and epoxy are applied prior to placing the cover on the IC assembly.

At operation 708, a force is applied to the cover plate of the assembly tool that urges the cover against the package substrate of the IC assembly. The force is sufficient to clamp the peripheral edges of the package substrate within the notches. The force is also sufficient flatten the package substrate against the highly flat base plate.

At operation 710, the clamped cover and IC assembly are heated to a temperature sufficient to enhance curing of the TCL and epoxy. In one example, the heater within the base assembly heats the IC assembly to a temperature of at least above room temperature, such as between 100 and 150 degrees Celsius.

At operation 712, the IC package, now having the cover 108 bonded to the IC assembly, is removed from the assembly tool. The assembled IC package is now ready for testing, cleaning and packaging for shipment and/or installation in an electronic device.

Figure 8:
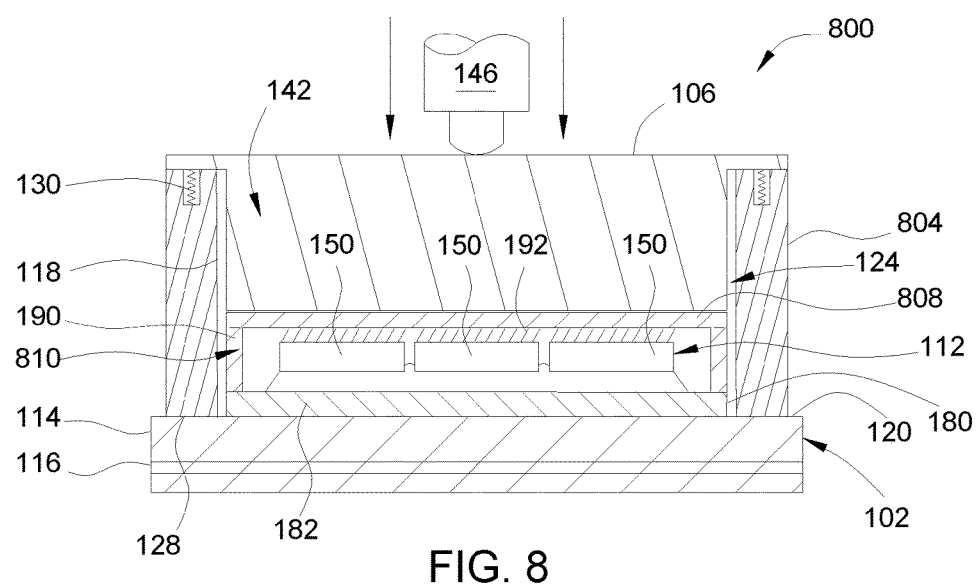
FIG. 8 is a sectional view of another assembly tool shown clamping an IC package.

FIG. 8 is a sectional view of another assembly tool 800 shown clamping an IC package 810. The IC package 810 is substantially similar to the IC package 110 described above, except wherein an outer edge of the cover 808 of the IC package 800 substantially aligns with an edge 180 of the package substrate 182. The assembly tool 800 is also substantially similar to the assembly tool 800 described above, except wherein a clamp 804 of the assembly tool 800 does not include a notch 134 such as present in the assembly tool 100. The assembly tool 800 relies on the flatness of the bottom surface 128 of the clamp 804 and the flatness of the top clamping surface 120 of the base plate 114 to reliable product the IC package 810 substantially without warpage and residual stress.

Thus, an IC package, assembly tool and method for assembling an IC package have been described above. The IC package manufactured utilizing the assembly tool advantageously resists cracking and delamination. Moreover, the IC package manufactured utilizing the assembly tool additionally has more uniform heat transfer between the cover and IC dies within the IC package, thereby reducing the occurrence of hot spots which may undesirably reduce the performance of the IC dies.

While the foregoing is directed to specific examples, other and further examples maybe devised without departing from the basic scope thereof, and the scope thereof is determined by the claims that follow.

What is claimed is:

1. An assembly tool for assembling an integrated circuit (IC) package, the tool comprising:
 a base assembly;
 a clamp removably disposed on the base assembly, the clamp comprising:
  sidewalls having a top surface and a bottom surface, the bottom surface configured to be disposed on the base assembly;
  a first aperture formed between the sidewalls, the first aperture extending between the top surface and the bottom surface; and
  a first notch formed in the bottom surface of the sidewalls and open to the first aperture; and
 a cover plate having a first boss configured to extend into the first aperture.

2. The assembly tool of claim 1, wherein the base assembly further comprises:
 a heater.

3. The assembly tool of claim 1 further comprising:
 resilient force generating objects disposed between the clamp and the cover plate.

4. The assembly tool of claim 1, wherein the first notch is configured to receive a perimeter edge of a package substrate.

5. The assembly tool of claim 1, wherein clamp further comprises:
 a plurality of apertures that includes the first aperture, each of the plurality of apertures open to the base assembly configured to accept a portion of a package substrate.

6. The assembly tool of claim 5, wherein cover plate further comprises:
   a plurality of bosses that includes the first boss, each of the plurality of bosses configured extend into a respective one of the plurality of apertures.

7. The assembly tool of claim 5, wherein clamp further comprises:
   a plurality of notches that includes the first notch, each of the plurality of notches opening into a respective one of the plurality of apertures.

* * * * *